(12) United States Patent
Fukuta et al.

(10) Patent No.: US 7,285,507 B2
(45) Date of Patent: Oct. 23, 2007

(54) CERAMIC COMPOSITION BEING FIRED AT LOW TEMPERATURE AND HAVING HIGH STRENGTH AND METHOD FOR PREPARING THE SAME, AND LAMINATED ELECTRONIC PARTS USING THE SAME

(75) Inventors: Tsuyoshi Fukuta, Tottori-ken (JP); Hiroyuki Itoh, Tottori-ken (JP); Osamu Yamada, Tottori-ken (JP)

(73) Assignee: Hitachi Metals, Ltd., Tokyo (JP)

( * ) Notice: Subject to any disclaimer, the term of this patent is extended or adjusted under 35 U.S.C. 154(b) by 25 days.

(21) Appl. No.: 10/537,461

(22) PCT Filed: Dec. 8, 2003

(86) PCT No.: PCT/JP03/15664

§ 371 (c)(1),
(2), (4) Date: Jun. 3, 2005

(87) PCT Pub. No.: WO2004/052804

PCT Pub. Date: Jun. 24, 2004

(65) Prior Publication Data

US 2006/0100087 A1    May 11, 2006

(30) Foreign Application Priority Data

Dec. 6, 2002    (JP) .............................. 2002-354955

(51) Int. Cl.
*C03C 10/06* (2006.01)
*C03C 14/00* (2006.01)
*H05K 3/46* (2006.01)

(52) U.S. Cl. .............................. 501/8; 501/10; 501/32; 501/125; 501/128; 428/210; 428/426; 428/428

(58) Field of Classification Search .................... 501/8, 501/10, 32; 428/210, 426, 428
See application file for complete search history.

(56) References Cited

U.S. PATENT DOCUMENTS

| 5,756,408 | A | * | 5/1998 | Terashi et al. .................. 501/8 |
| 6,121,174 | A | * | 9/2000 | Yokoi et al. .................... 501/8 |
| 6,201,307 | B1 | * | 3/2001 | Terashi et al. ............. 257/784 |
| 6,699,605 | B2 | * | 3/2004 | Umayahara et al. ........ 428/701 |

FOREIGN PATENT DOCUMENTS

| JP | 6-199541 A | 7/1994 |
| JP | 2000-272960 A | 10/2000 |

* cited by examiner

*Primary Examiner*—Karl Group
(74) *Attorney, Agent, or Firm*—Sughrue Mion Pllc.

(57) ABSTRACT

A high-strength, low-temperature-sintered ceramic composition having a structure comprising a $SrAl_2Si_2O_8$ Crystal and an $Al_2O_3$ crystal, the $SrAl_2Si_2O_8$ crystal being composed of hexagonal $SrAl_2Si_2O_8$ alone or hexagonal $SrAl_2Si_2O_8$ and monoclinic $SrAl_2Si_2O_8$, and a peak intensity ratio represented by $I_{101}/(I_{101}+I_{002}) \times 100$ being 5% or more in an X-ray diffraction measurement by a Cu—Kα line, wherein $I_{101}$ represents a peak intensity of a (101) plane of the hexagonal $SrAl_2Si_2O_8$, and $I_{002}$ represents a peak intensity of a (002) plane of the monoclinic $SrAl_2Si_2O_8$.

18 Claims, 7 Drawing Sheets

CERAMIC COMPOSITION BEING FIRED AT LOW TEMPERATURE AND HAVING HIGH STRENGTH AND METHOD FOR PREPARING THE SAME, AND LAMINATED ELECTRONIC PARTS USING THE SAME

FIELD OF THE INVENTION

The present invention relates to a high-strength, low-temperature-sintered ceramic composition for use in laminated circuit substrates, particularly to a high-strength, low-temperature-sintered ceramic composition having high mechanical strength, which can be simultaneously sintered with electrodes made of a low-melting-point metal such as silver, gold, copper, etc., its production method, and a laminated electronic part for use mainly in cell phones, etc., which is made of such ceramic composition.

BACKGROUND OF THE INVENTION

Laminated ceramic circuit substrates having internal layer circuits, onto which semiconductor elements such as ICs, etc. and various electronic parts are mounted, have conventionally been known. Such laminated circuit substrates have conventionally been made of alumina having excellent heat dissipation, electric properties, mechanical strength, etc. as a whole. Because alumina substrates have as high sintering temperatures as 1300-1600° C., high-melting-point metals such as W, Mo, etc. are used for electrodes. However, these electrode materials have high electric resistivity, suffering from large signal transmission loss in high-frequency circuits of more than several hundreds of MHz in cell phones, etc.

In a mobile communications field of cell phones, etc., a small signal transmission loss is particularly required. Accordingly, electrode materials having small electric resistivity such as silver, gold, copper, etc. have come to be used in place of high-melting-point metals such as W, Mo, etc., and glass ceramics and low-temperature-sintered ceramic compositions simultaneously sintered with the electrode materials have come to be widely used for laminated ceramic circuit substrates (U.S. Pat. No. 6,121,174).

However, the laminated circuit substrates are extremely poorer in mechanical strength than the alumina substrate. For instance, the alumina substrate has a bending strength of about 400 MPa, while the laminated circuit substrates have a bending strength of about 150 MPa. The bending strength of 150 MPa or more is sufficient for practical use in the laminated circuit substrates in conventional cell phones, etc. However, as electronic parts used in cell phones, etc. become thinner, laminated circuit substrates used therein also become as thin as 1 mm or less, so that conventional laminated ceramic circuit substrates fail to provide sufficient mechanical strength.

Thus, higher strength is required for laminated circuit substrates used in cell phones, etc., such that cracking and breakage are not generated, for instance, by the deformation such as twisting, bending, etc. of mounting substrates or by impact when dropped.

OBJECTS OF THE INVENTION

Accordingly, an, object of the present invention is to provide a high-strength, low-temperature-sintered ceramic composition capable of being sintered simultaneously with a low-melting-point metal, thereby forming a circuit substrate resistant to cracking and breakage.

Another object of the present invention is to provide a method for producing such a low-temperature-sintered ceramic composition.

A further object of the present invention is to provide a laminated electronic part comprising dielectric layers made of such a low-temperature-sintered ceramic composition.

DISCLOSURE OF THE INVENTION

As a result of investigating the strength of crystal phases constituting a low-temperature-sintered ceramic composition to improve the mechanical strength of a laminated circuit substrate made of the low-temperature-sintered ceramic composition, it has been found that the mechanical strength of a $SrAl_2Si_2O_8$ crystal (strontium feldspar) extremely varies depending on its crystal structure.

With respect to the stoichiometric composition of $SrAl_2Si_2O_8$, an oxide of Al, Si and Sr, crystals precipitated in a sintering process have been investigated in detail by an X-ray diffraction method. As a result, it has been found that (a) the structure of a $SrAl_2Si_2O_8$ composition is mostly composed of hexagonal $SrAl_2Si_2O_8$ and unreacted $Al_2O_3$ crystal and $SrSiO_3$ crystal in a temperature range of 950° C. to 1050° C., though it slightly contains monoclinic $SrAl_2Si_2O_8$, that (b) the hexagonal $SrAl_2Si_2O_8$ is turned to monoclinic (b-axis) $SrAl_2Si_2O_8$ in a temperature range of higher than 1050° C. and 1100° C. or lower, and that (c) the $SrAl_2Si_2O_8$ composition is composed of monoclinic $SrAl_2Si_2O_8$, an $Al_2O_3$ crystal and a $SrSiO_3$ crystal without hexagonal $SrAl_2Si_2O_8$ at higher than 1100° C.

When the structure contains hexagonal $SrAl_2Si_2O_8$, a stoichiometric composition of $SrAl_2Si_2O_8$ has a bending strength of 300 MPa or more. However, when the $SrAl_2Si_2O_8$ crystal in the structure is monoclinic, the bending strength is reduced to about 150 MPa. Though it is not clear why there is remarkable difference in mechanical strength between the hexagonal $SrAl_2Si_2O_8$ and the monoclinic $SrAl_2Si_2O_8$, it is considered that because the $SrAl_2Si_2O_8$ crystal, a main crystal phase, is hexagonal like the $Al_2O_3$ crystal, both crystal phases are strongly bonded to each other, resulting in increased mechanical strength. It has been found that a structure comprising both hexagonal $SrAl_2Si_2O_8$ and an $Al_2O_3$ crystal in a mixed manner provides the low-temperature-sintered ceramic composition with improved mechanical strength, while keeping a relative dielectric constant necessary for electronic parts and useful dielectric properties such as fQ exceeding 2 THz, etc. The present invention has been completed based on such findings.

The high-strength, low-temperature-sintered ceramic composition according to the first embodiment of the present invention comprises hexagonal $SrAl_2Si_2O_8$ and an $Al_2O_3$ crystal in a structure.

The high-strength, low-temperature-sintered ceramic composition according to the second embodiment of the present invention comprises hexagonal $SrAl_2Si_2O_8$ in an $Al_2O_3$—$SiO_2$—SrO-based matrix, in which $Al_2O_3$ crystal grains are precipitated.

The matrix of the high-strength, low-temperature-sintered ceramic composition is (a) an amorphous phase, in which hexagonal $SrAl_2Si_2O_8$ is precipitated, or (b) substantially composed of a $SrAl_2Si_2O_8$ crystal, at least part of which is hexagonal $SrAl_2Si_2O_8$. The matrix may contain monoclinic $SrAl_2Si_2O_8$.

The high-strength, low-temperature-sintered ceramic composition according to the third embodiment of the present invention has a structure comprising a $SrAl_2Si_2O_8$ crystal and an $Al_2O_3$ crystal, the $SrAl_2Si_2O_8$ crystal being composed of hexagonal $SrAl_2Si_2O_8$ alone or hexagonal $SrAl_2Si_2O_8$ and monoclinic $SrAl_2Si_2O_8$, and a peak intensity ratio represented by $I_{101}(I_{101}+I_{002})\times100$ being 5% or more in an X-ray diffraction measurement by a Cu—Kα line, wherein $I_{101}$ represents a peak intensity of a (101) plane of the hexagonal $SrAl_2Si_2O_8$, and $I_{002}$ represents a peak intensity of a (002) plane of the monoclinic $SrAl_2Si_2O_8$.

The peak intensity ratio is preferably 10% or more, more preferably 50% or more.

The high-strength, low-temperature-sintered ceramic composition of the present invention preferably has a structure comprising $Al_2O_3$ crystal grains in a matrix substantially composed of a $SrAl_2Si_2O_8$ crystal, the $SrAl_2Si_2O_8$ crystal being composed of hexagonal $SrAl_2Si_2O_8$ alone or hexagonal $SrAl_2Si_2O_8$ and monoclinic $SrAl_2Si_2O_8$, and a ratio of the hexagonal $SrAl_2Si_2O_8$ in the $SrAl_2Si_2O_8$ crystal being 60% or more, and the ceramic composition having a bending strength of 400 MPa or more.

The high-strength, low-temperature-sintered ceramic composition of the present invention preferably has a first composition comprising (a) 100% by mass of main components comprising 10-60% by mass of Al (as $Al_2O_3$), 25-60% by mass of Si (as $SiO_2$) and 7.5-50% by mass of Sr (as SrO), (b) auxiliary components comprising at least one selected from the group consisting of 0.1-10% by mass of Bi (as $Bi_2O_3$), 0.1-5% by mass of Na (as $Na_2O$), 0.1-5% by mass of K (as $K_2O$) and 0.1-5% by mass of Co (as CoO), and at least one selected from the group consisting of 0.01-5% by mass of Cu (as CuO), 0.01-5% by mass of Mn (as $MnO_2$), 0.01-5% by mass of Ag and 0.01-2% by mass of Zr (as $ZrO_2$), and (c) inevitable impurities.

The high-strength, low-temperature-sintered ceramic composition of the present invention preferably has a second composition comprising (a) 100% by mass of main components comprising 10-60% by mass of Al (as $Al_2O_3$), 25-60% by mass of Si (as $SiO_2$), 7.5-50% by mass of Sr (as SrO) and 20% or less by mass of Ti (as $TiO_2$), (b) auxiliary components comprising at least one selected from the group consisting of 0.1-10% by mass of Bi (as $Bi_2O_3$), 0.1-5% by mass of Na (as $Na_2O$), 0.1-5% by mass of K (as $K_2O$) and 0.1-5% by mass of Co (as CoO), and at least one selected from the group consisting of 0.01-5% by mass of Cu (as CuO), 0.01-5% by mass of Mn (as $MnO_2$), 0.01-5% by mass of Ag and 0.01-2% by mass of Zr (as $ZrO_2$), and (c) inevitable impurities.

The $Al_2O_3$ crystal grain preferably have an average diameter of 1 μm or less.

The method for producing the above high-strength, low-temperature-sintered ceramic composition comprises sintering a ceramic green body comprising aluminum oxide, silicon oxide and strontium oxide, or aluminum oxide, silicon oxide, strontium oxide and titanium oxide as main starting materials, under such temperature and time conditions that a ratio of hexagonal $SrAl_2Si_2O_8$ in a $SrAl_2Si_2O_8$ crystal formed in a ceramic structure becomes 5% or more. The sintering temperature and time are set such that the ratio of hexagonal $SrAl_2Si_2O_8$ becomes preferably 10% or more, more preferably 50% or more, particularly preferably 60% or more.

The laminated electronic part of the present invention comprises pluralities of dielectric layers made of the above high-strength, low-temperature-sintered ceramic composition, a conductive pattern of a low-melting-point metal being formed on each of the dielectric layers. The low-melting-point metal is preferably silver, copper, gold or an alloy thereof.

The conductive pattern preferably constitutes an inductance element and/or a capacitance element. At least one selected from the group consisting of an inductance element, a capacitance element, a switching element and a filter element is preferably mounted onto the laminated electronic part.

BEST MODE FOR CARRYING OUT THE INVENTION

The high-strength, low-temperature-sintered ceramic composition of the present invention comprises Al, Si and Sr, or Al, Si, Sr and Ti, as main components, is sintered at a temperature of 1050° C. or lower, preferably 1000° C. or lower, and has a structure comprising at least hexagonal $SrAl_2Si_2O_8$ and $Al_2O_3$ crystal grains. Internal electrodes made of a low-melting-point metal (silver, copper, gold or an alloy thereof) having high conductivity can be formed on dielectric layers made of such low-temperature-sintered ceramic composition, and integrated by sintering after lamination, to provide high-frequency electronic parts having excellent mechanical strength, and extremely small loss due to a high Q value. Accordingly, when applied to dielectric resonators, filters, laminated inductors or capacitors, and their high-frequency laminated composite substrates, etc., circuit devices having excellent mechanical strength and microwave properties and low loss can be obtained.

Al is preferably 10-60% by mass as $Al_2O_3$, Si is preferably 25-60% by mass as $SiO_2$, and Sr is 7.5-50% by mass as SrO. With these metal contents outside these ranges, sufficient density cannot be obtained by sintering at as low temperatures as 1000° C. or lower, resulting in a porous low-temperature-sintered ceramic composition, which does not have good properties due to moisture absorption, etc.

Ti has a function to increase a temperature coefficient τf of a resonance frequency of the low-temperature-sintered ceramic composition. Ti is preferably 0-20% by mass as $TiO_2$. As the Ti content increases, the temperature coefficient of a resonance frequency of the low-temperature-sintered ceramic composition increases. When the temperature coefficient of a resonance frequency τf of the low-temperature-sintered ceramic composition is on the minus side of about −20 ppm/° C. to −40 ppm/° C., τf can be easily adjusted to 0 ppm/° C. by increasing the Ti content. However, when the amount of Ti is more than 20% by mass as $Ti_2$, sufficient density cannot be obtained by sintering at as low temperatures as 1000° C. or lower, resulting in a porous low-temperature-sintered ceramic composition, which does not have good properties due to moisture absorption, etc.

This low-temperature-sintered ceramic composition preferably contains, as auxiliary components, at least one selected from the group consisting of Bi, Na, K and Co, and at least one selected from the group consisting of Cu, Mn, A and Zr. Unless otherwise mentioned, the amounts of these metals are expressed as amounts as oxides per 100% by mass of the total of the main components. These metals are preferably added in the form of oxides or carbonates.

Bi, Na, K and Co have a function to lower the softening point of glass obtained by the glassification of other components than $Al_2O_3$ in a calcination process, enabling lower-temperature sintering, and thus making it possible to obtain a low-temperature-sintered ceramic composition having dielectric properties such as a high Q value at a sintering temperature of 1000° C. or lower.

Bi is preferably 0.1-10% by mass as $Bi_2O_3$. When Bi is more than 10% by mass, the Q value is too small. The more preferred content of Bi is 5% or less by mass. When the amount of Bi is less than 0.1% by mass, the effect of lowering a sintering temperature is insufficient. The more preferred amount of Bi added is 0.2% or more by mass.

Na is preferably 0.1-5% by mass as $Na_2O$. When Na is less than 0.1% by mass, the effect of lowering a sintering temperature is insufficient. When Na exceeds 5% by mass, the resultant low-temperature-sintered ceramic composition has too large dielectric loss, losing applicability for practical use.

K is preferably 0.1-5% by mass as $K_2O$. When K is less than 0.1% by mass, the effect of lowering a sintering temperature is insufficient. When K exceeds 5% by mass, the resultant low-temperature-sintered ceramic composition has too large dielectric loss, losing applicability for practical use.

At higher sintering temperatures, Na and K form a feldspar such as a $NaAlSi_3O_8$ crystal, a $KAlSi_3O_8$ crystal, etc. together with Al and Si, thereby improving the fQ of the low-temperature-sintered ceramic composition.

Co is preferably 0.1-5% by mass as CoO. When Co is less than 0.1% by mass, the effect of lowering a sintering temperature is insufficient, resulting in difficulty in obtaining a dense, low-temperature-sintered ceramic composition by sintering at 900° C. or lower. When Co exceeds 5% by mass, the crystallization temperature of the low-temperature-sintered ceramic composition is higher than 1000° C., resulting in too large dielectric loss at 1000° C. or lower, and thus losing applicability for practical use.

Cu, Mn, Ag and Zr are added to achieve low-temperature sintering, because they have a function to accelerate the crystallization of a dielectric ceramic composition mainly in a sintering process.

Cu is preferably 0.01-5% by mass as CuO. When Cu is less than 0.01% by mass, its effect is insufficient, making it difficult to obtain a low-temperature-sintered ceramic composition having a high Q value by sintering at 900° C. or lower. When Cu exceeds 5% by mass, the ceramic composition loses low-temperature sinterability.

Mn is preferably 0.01-5% by mass as $MnO_2$. When Mn is less than 0.01% by mass, its effect is insufficient, making it difficult to obtain a low-temperature-sintered ceramic composition having a high Q value by sintering at 900° C. or lower. When Mn exceeds 5% by mass, the ceramic composition loses low-temperature sinterability.

Ag is preferably 0.01-5% by mass. When Ag exceeds 5% by mass, the ceramic composition has too large dielectric loss, losing its applicability. The more preferred amount of Ag is 2% or less by mass.

Zr is preferably 0.01-2% by mass as $ZrO_2$. When Zr is less than 0.01% by mass, there is no sufficient effect of improving the mechanical strength of the low-temperature-sintered ceramic composition. When it exceeds 2% by mass, the fQ is lowered. To expect a larger effect of improving mechanical strength by adding $ZrO_2$, Zr is more preferably 0.3% by mass to 1.5% by mass.

The inevitable impurities may be, for instance, Y, Fe, Ca, Ga, Cr, etc. The contents of the inevitable impurities should be within such ranges as not to deteriorate the properties of the low-temperature-sintered ceramic composition.

The above low-temperature-sintered ceramic composition is produced by sintering a green body uniformly comprising aluminum oxide, silicon oxide and strontium oxide (or aluminum oxide, silicon oxide, strontium oxide and titanium oxide) as main materials for constituting main components of Al, Si and Sr (or Al, Si, Sr and Ti), and oxides or carbonates as auxiliary materials for constituting auxiliary components comprising at least one selected from the group consisting of Bi, Na, K and Co and at least one selected from the group consisting of Cu, Mn, Ag and Zr, while controlling the sintering temperature and time such that a ratio (peak intensity ratio) of hexagonal $SrAl_2Si_2O_8$ in a $SrAl_2Si_2O_8$ crystal formed in a ceramic structure is 5% or more. The peak intensity ratio of the hexagonal $SrAl_2Si_2O_8$ is preferably 10% or more, more preferably 50% or more, particularly 60% or more. Accordingly, to meet this condition, the sintering temperature and time are preferably controlled.

The low-temperature-sintered ceramic composition has a bending strength of preferably 300 MPa or more, more preferably 400 MPa or more. Accordingly, it is preferable to control the sintering temperature and time to meet this condition. There is a correlation between the peak intensity ratio of the hexagonal $SrAl_2Si_2O_8$ and the bending strength. Generally, the higher the peak intensity ratio, the higher the bending strength. Accordingly, the sintering temperature and time are controlled preferably to have a peak intensity ratio of 50% or more and a bending strength of 300 MPa or more, more preferably to have a peak intensity ratio of 60% or more and a bending strength of 400 MPa or more.

The optimum sintering temperature and time generally vary depending on the composition of the low-temperature-sintered ceramic composition. Accordingly, to surely impart high peak intensity ratio and bending strength to each low-temperature-sintered ceramic composition, the optimum sintering temperature and time should be determined experimentally depending on its composition. Generally, the sintering temperature is preferably 1000° C. or lower, more preferably 950° C. or lower, particularly preferably 900° C. or lower. The sintering time is preferably about 2-4 hours.

The low-temperature-sintered ceramic composition of the present invention obtained by such method preferably has a relative dielectric constant ε of about 6-9, and a fQ (f is a resonance frequency) on a practical level of 3000 GHz (3 THz) or more.

The laminated electronic part of the present invention may be obtained by forming a conductive pattern made of a low-melting-point metal (silver, copper, gold or an alloy thereof) on each dielectric layer made of the above low-temperature-sintered ceramic composition, and laminating pluralities of dielectric layers having the resultant conductive patterns. The conductive patterns per se may be known, for instance, constituting inductance elements and/or capacitance elements. At least one of an inductance element, a capacitance element, a switching element and a filter element may be mounted onto the laminated electronic part. The layer structure of the laminated electronic part per se may be known.

The present invention will be explained in further detail referring to Examples below without intention of restricting it thereto.

EXAMPLE 1

$Al_2O_3$ powder, $SiO_2$ powder, $SrCO_3$ powder, $TiO_2$ powder, $Bi_2O_3$ powder, CuO powder, $MnO_2$ powder, $Na_2CO_3$ powder and $K_2CO_3$ powder were mixed with pure water in a ball mill to obtain a slurry. After adding PVA to this slurry in a proportion of 1% by mass per the dry weight of the starting material powder, the slurry was dried by a spray dryer to obtain a dry granular powder having an average diameter of about 0.1 mm.

$Al_2O_3$ powder having a purity of 99.9% and an average diameter of 0.5 μm, $SiO_2$ powder having a purity of 99.9% or more and an average diameter of 0.5 μm or less, and $SrCO_3$ powder having a purity of 99.9% and an average diameter of 0.5 μm were charged into a polyethylene ball-milling pot, such that they formed a stoichiometric composition of $SrAl_2Si_2O_8$ (31.30% by mass of $Al_2O_3$, 36.89% by mass of $SiO_2$, and 31.81% by mass of SrO). With zirconium oxide balls and pure water, they were wet-mixed for 20 hours. The resultant slurry was dried by heating, and then disintegrated by an automated mortar. The resultant mixed powder was calcined at 850° C. for 2 hours in an alumina crucible, to obtain a silicate glass powder containing an $Al_2O_3$ crystal.

This calcined powder was wet-pulverized for 40 hours in the above ball mill, and then dried. Part of the resultant dry calcined powder was charged into a ball mill together with pure water, and pulverized to an average diameter of 1.0 μm. After adding polyvinyl alcohol (PVA) to the slurry containing the resultant pulverized powder in a proportion of 1.5% by mass per 100% by mass of the pulverized powder, the slurry was granulated and dried by a spray dryer to obtain a granulated powder having an average diameter of about 0.1 mm.

The granulated powder was pressed under a pressure of 200 MPa, to obtain a cylindrical green body. This green body was heated from room temperature to a temperature of 950-1200° C. at a speed of 200° C./hr in the air, sintered while keeping the above temperature for 2 hours, and then cooled to room temperature at a speed of 200° C./hr. The relative dielectric constant ε of the resultant sintered body was measured at a resonance frequency of 8-15 GHz by a cylindrical resonator. The crystallinity of Samples was confirmed by X-ray diffraction with a Cu—Kα line.

A test piece of 38 mm×12 mm×1 mm produced in the same manner as above was subjected to a three-point bending test (JIS C2141) at a fulcrum distance of 30 mm and a load-applying speed of 0.5 mm/min, to determine a bending strength from the maximum load, at which the test piece was broken. The results are shown in Table 1. The data of alumina are also shown in Table 1.

As a ratio of hexagonal $SrAl_2Si_2O_8$ to monoclinic $SrAl_2Si_2O_8$ in the structure, a ratio of plane diffraction intensities of both crystals was determined. The ratio of plane diffraction intensities is expressed by a peak intensity ratio determined from a peak intensity $I_{101}$ of a (101) plane of the hexagonal $SrAl_2Si_2O_8$ appearing near 22.9° and a peak intensity $I_{002}$ of a (002) plane of the monoclinic $SrAl_2Si_2O_8$ appearing near 27.7° in an X-ray diffraction with a Cu—Kα line, by the formula of $I_{101}/(I_{101}+I_{002})\times100$. The results are shown in Table 1.

TABLE 1

| Sample No.[1] | Sintering Temp. (° C.) | Keeping Time (hr) | Peak Intensity Ratio[2] | Bending Strength (MPa) | Relative Dielectric Constant ε | fQ (THz) | Crystal Phase Contained[3] |
|---|---|---|---|---|---|---|---|
| 1 | 950 | 2 | 97.9 | 352 | 8.0 | 14 | HS, MS, A, S |
| 2 | 1000 | 2 | 98.4 | 368 | 6.8 | 15 | HS, MS, A, S |
| 3 | 1050 | 2 | 92.7 | 342 | 7.1 | 14 | HS, MS, A, S |
| 4* | 1100 | 2 | 0 | 158 | 7.0 | 30 | MS, A, S |
| 5* | 1200 | 2 | 0 | 171 | 7.0 | 31 | MS, A, S |
| Alumina | 1500 | — | — | 400 | 9.5 | — | — |

Note
[1]*shows Samples outside the scope of the present invention.
[2]$I_{101} / (I_{101} + I_{002}) \times 100$.
[3]HS: Hexagonal $SrAl_2Si_2O_8$, MS: Monoclinic $SrAl_2Si_2O_8$, A: $Al_2O_3$ crystal, and S: $SrSiO_3$ crystal.

As is clear from Table 1, the low-temperature-sintered ceramic compositions obtained at the sintering temperatures of 950° C.-1050° C. contained a $SrAl_2Si_2O_8$ crystal, an $Al_2O_3$ crystal and $SrSiO_3$ crystal in their structures. The $Al_2O_3$ crystal and the $SrSiO_3$ crystal are crystals not turned to a $SrAl_2Si_2O_8$ crystal.

The $SrAl_2Si_2O_8$ crystal was substantially hexagonal as a whole. The low-temperature-sintered ceramic compositions substantially composed of the hexagonal $SrAl_2Si_2O_8$ had a bending strength of 300 MPa or more, and excellent dielectric properties such as a relative dielectric constant $\epsilon$ of 6.8-8.0 and fQ of 14-15 THz.

The low-temperature-sintered ceramic compositions obtained at the sintering temperatures of 900° C. or lower were poor in both bending strength and dielectric properties, because their structures were mostly composed of an $Al_2O_3$ crystal and a glass phase without a precipitated $SrAl_2Si_2O_8$ crystal.

The X-ray diffraction patterns of the low-temperature-sintered ceramic compositions obtained at the sintering temperatures of 1100° C. or higher revealed that $SrAl_2Si_2O_8$ was substantially entirely monoclinic in their structures. It is thus clear that hexagonal $SrAl_2Si_2O_8$ is tuned to monoclinic $SrAl_2Si_2O_8$ at sintering temperatures of 1100° C. or higher. These low-temperature-sintered ceramic compositions were unsatisfactory for laminated electronic parts because of a bending strength of at most about 170 MPa, despite high dielectric properties (fQ).

It is thus clear that the control of the conversion of a $SrAl_2Si_2O_8$ crystal from hexagonal to monoclinic can provide low-temperature-sintered ceramic compositions with higher mechanical strength than that of conventional low-temperature-sintered ceramic compositions while retaining excellent dielectric properties.

EXAMPLE 2

The granules were calcined at the highest temperature of 800° C. for 2 hours in a continuous furnace, to obtain a calcined powder made of silicate glass containing an $Al_2O_3$ crystal and a $TiO_2$ crystal. The composition of the calcined powder was 49% by mass of $Al_2O_3$, 34% by mass of $SiO_2$, 8.2% by mass of SrO, 3% by mass of $TiO_2$, 2.5% by mass of $Bi_2O_3$, 2% by mass of $Na_2O$, 0.5% by mass of $K_2O$, 0.3% by mass of CuO, and 0.5% by mass of $MnO_2$, on an oxide basis.

Cylindrical green bodies were produced from this calcined powder in the same manner as in Example 1. These green bodies were heated from room temperature to temperatures of 825-900° C. at a speed of 200° C./hr in the air, sintered while keeping the above temperature for 2 hours, and then cooled to room temperature at a speed of 200° C./hr.

The relative dielectric constants $\epsilon$ of the resultant sintered bodies were measured at a resonance frequency of 8-15 GHz by a cylindrical resonator. Each test piece was also subjected to a three-point bending test in the same manner as in Example 1, to determine a bending strength from the maximum load, at which the test piece was broken. The results are shown in Table 2. The data of alumina are also shown in Table 2.

TABLE 2

| Sample No.[1] | Sintering Temp. (° C.) | Keeping Time (hr) | Peak Intensity Ratio[2] | Bending Strength (MPa) | Relative Dielectric Constant $\epsilon$ | fQ (THz) | Crystal Phase Contained[3] |
|---|---|---|---|---|---|---|---|
| 6* | 825 | 2 | — | 261 | — | 2 | A |
| 7* | 850 | 1 | — | 271 | — | 2 | A |
| 8 | 850 | 2 | 100 | 430 | 8.2 | 3 | HS, A |
| 9 | 850 | 3 | 66.2 | 432 | 8.2 | 4 | HS, MS, A |
| 10 | 850 | 5 | 50.9 | 380 | 8.1 | 5 | HS, MS, A |
| 11 | 850 | 10 | 7.7 | 332 | 8.1 | 12 | HS, MS, A, N |
| 12 | 860 | 2 | 64.4 | 435 | 8.1 | 4 | HS, MS, A |
| 13 | 875 | 2 | 17.7 | 310 | 8.1 | 13 | HS, MS, A, N |
| 14* | 900 | 2 | 0 | 283 | 8.1 | 13 | MS, A, N |
| Alumina | 1500 | — | — | 400 | 9.5 | — | — |

Note
[1]*indicates Samples outside the scope of the present invention.
[2]$I_{101} / (I_{101} + I_{002}) \times 100$.
[3]HS: Hexagonal $SrAl_2Si_2O_8$, MS: Monoclinic $SrAl_2Si_2O_8$, A: $Al_2O_3$ crystal, and N: (Na, K)$Si_3AlO_8$ crystal.

FIGS. 1-4 show the X-ray diffraction patterns (Cu—K$\alpha$) of the low-temperature-sintered ceramic compositions (Samples 8 and 12-14) sintered under the conditions of 850° C.×2 hours, 860° C.×2 hours, 875° C.×2 hours and 900° C.×2 hours, respectively. In FIGS. 1-4, white circles represent an $Al_2O_3$ crystal, black triangles represent hexagonal $SrAl_2Si_2O_8$, and white triangles represent monoclinic $SrAl_2Si_2O_8$. Under the sintering conditions of 850° C.×2 hours, hexagonal $SrAl_2Si_2O_8$ was precipitated together with an $Al_2O_3$ crystal, a $TiO_2$ crystal and a $SiO_2$ crystal. As the sintering temperature was elevated, more monoclinic $SrAl_2Si_2O_8$ was precipitated, with its diffraction peak intensity increased.

Table 2 shows that a bending strength of 300 MPa or more can be obtained, when a peak intensity ratio represented by $I_{101}/(I_{101}+I_{002})\times100$, which corresponds to a ratio of hexagonal $SrAl_2Si_2O_8$ in the structure, is 7.7% or more, wherein $I_{101}$ represents a peak intensity of a (101) plane of the hexagonal $SrAl_2Si_2O_8$, and $I_{002}$ represents a peak intensity of a (002) plane of the monoclinic $SrAl_2Si_2O_8$. Generally, the peak intensity ratio corresponding to the ratio of hexagonal $SrAl_2Si_2O_8$ in the structure is preferably 5% or more. Though a bending strength of more than 250 MPa was obtained even in Samples 6 and 7, it is considered that $Al_2O_3$ crystal grains segregated in a glass phase act as a filler, resulting in increase in strength. However, any of the ceramic compositions of Samples 6 and 7 was not so dense that it could not be used for practical applications.

Figure 1:
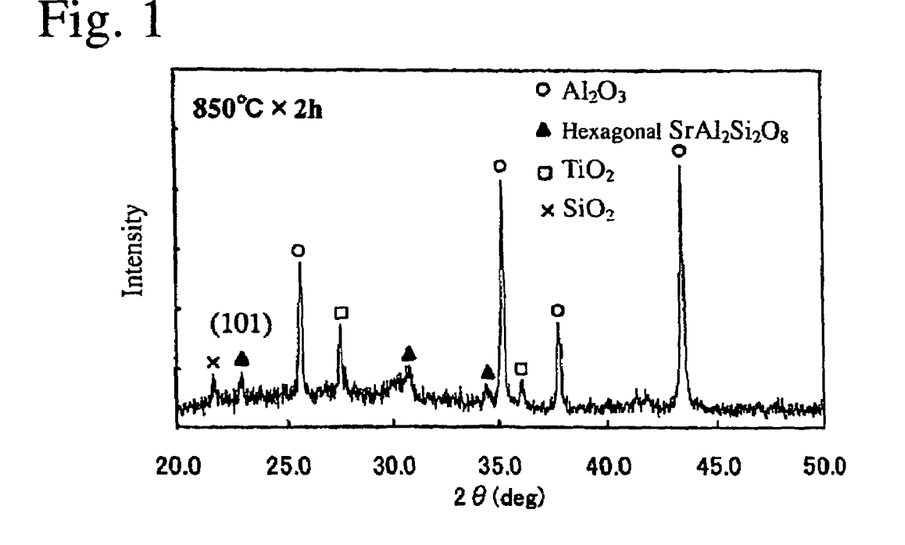
FIG. 1 is a graph showing the X-ray diffraction pattern of a low-temperature-sintered ceramic composition (Sample 8) according to one embodiment of the present intention.
Figure 2:
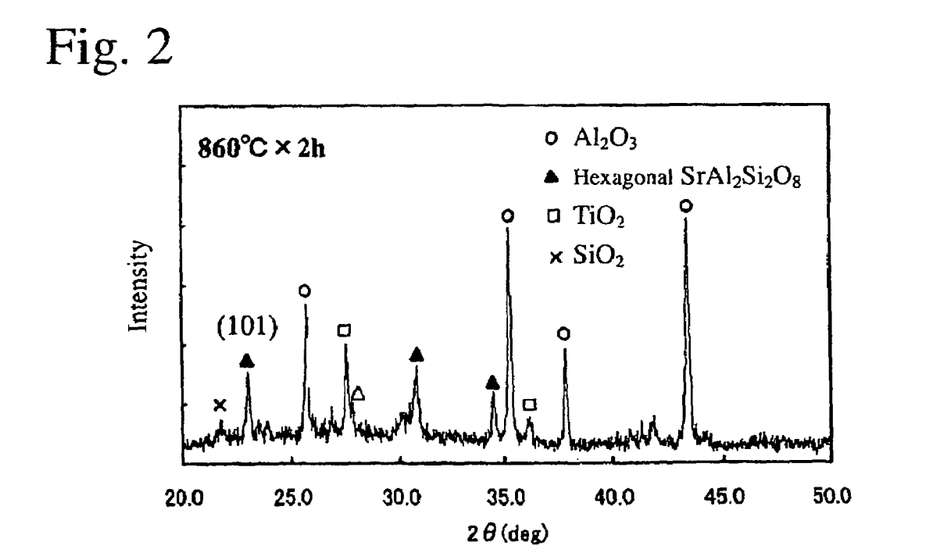
FIG. 2 is a graph showing the X-ray diffraction pattern of a low-temperature-sintered ceramic composition (Sample 12) according to another embodiment of the present invention.
Figure 3:
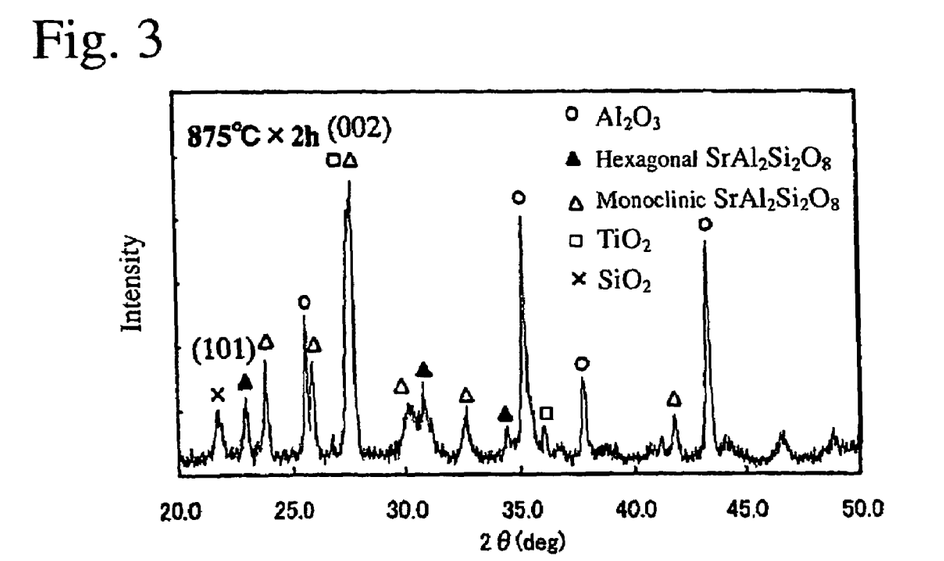
FIG. 3 is a graph showing the X-ray diffraction pattern of a low-temperature-sintered ceramic composition (Sample 13) according to a further embodiment of the present invention.
Figure 4:
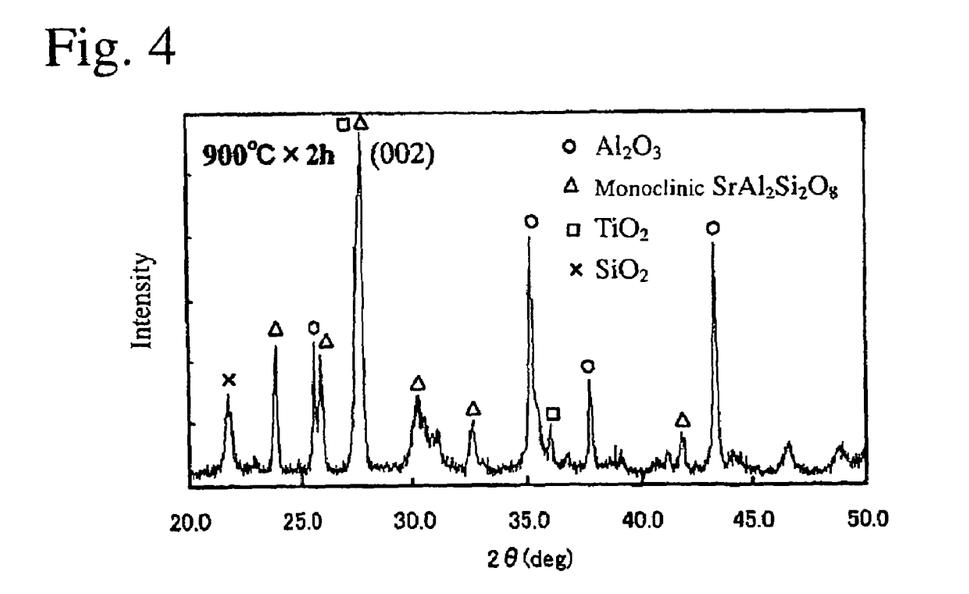
FIG. 4 is a graph showing the X-ray diffraction pattern of a low-temperature-sintered ceramic composition (Sample 14) outside the scope of the present invention.

In FIG. 4 showing the diffraction pattern of the low-temperature-sintered ceramic composition obtained under the sintering conditions of 900° C.×2 hours, there was a diffraction peak on the right shoulder of the diffraction peak of monoclinic $SrAl_2Si_2O_8$ near 31°. Considering other diffraction patterns, this diffraction peak appears to correspond to a (041) plane of monoclinic $SrAl_2Si_2O_8$. Accordingly, it has been found that this low-temperature-sintered ceramic composition does not substantially contain hexagonal $SrAl_2Si_2O_8$ in its structure.

Though the structures of Samples 6-14 did not contain a SrSiO$_3$ crystal observed in Example 1, a silicate crystal (feldspar) containing Na and/or K, which appeared to be sanidine and albite, was observed in Samples 11, 13 and 14. Samples 11, 13 and 14 exhibited excellent fQ, which was considered to be due to the feldspar.

Because the ratio of hexagonal SrAl$_2$Si$_2$O$_8$ in the structure varies depending on the composition and sintering conditions (sintering temperature and time) of the low-temperature-sintered ceramic compositions, the ratio of hexagonal SrAl$_2$Si$_2$O$_8$ in the structure can be easily controlled by adjusting the composition and sintering conditions.

Figure 5:
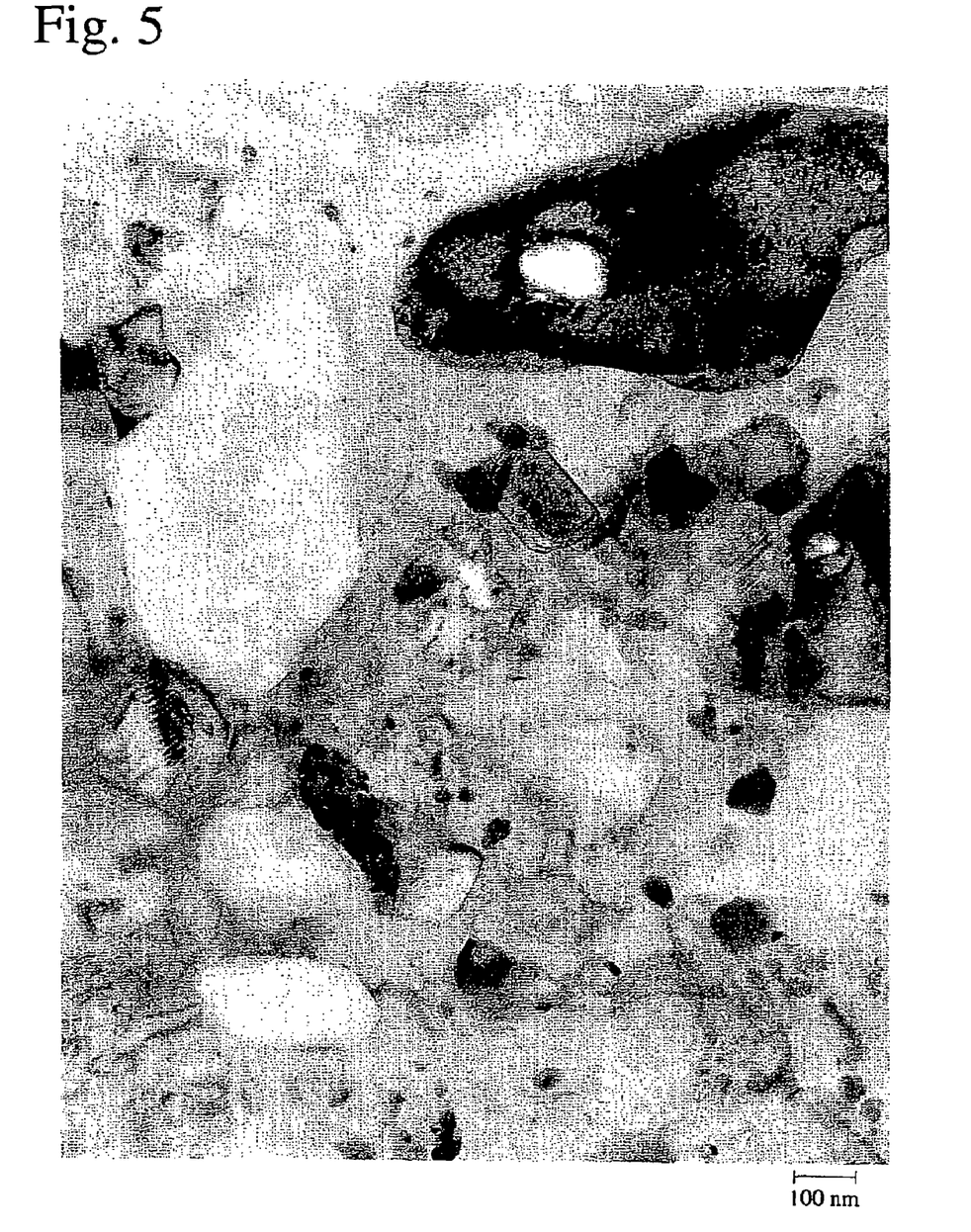
FIG. 5 is a transmission electron (TEM) photomicrograph of the low-temperature-sintered ceramic composition according to one embodiment of the present invention.
Figure 6:
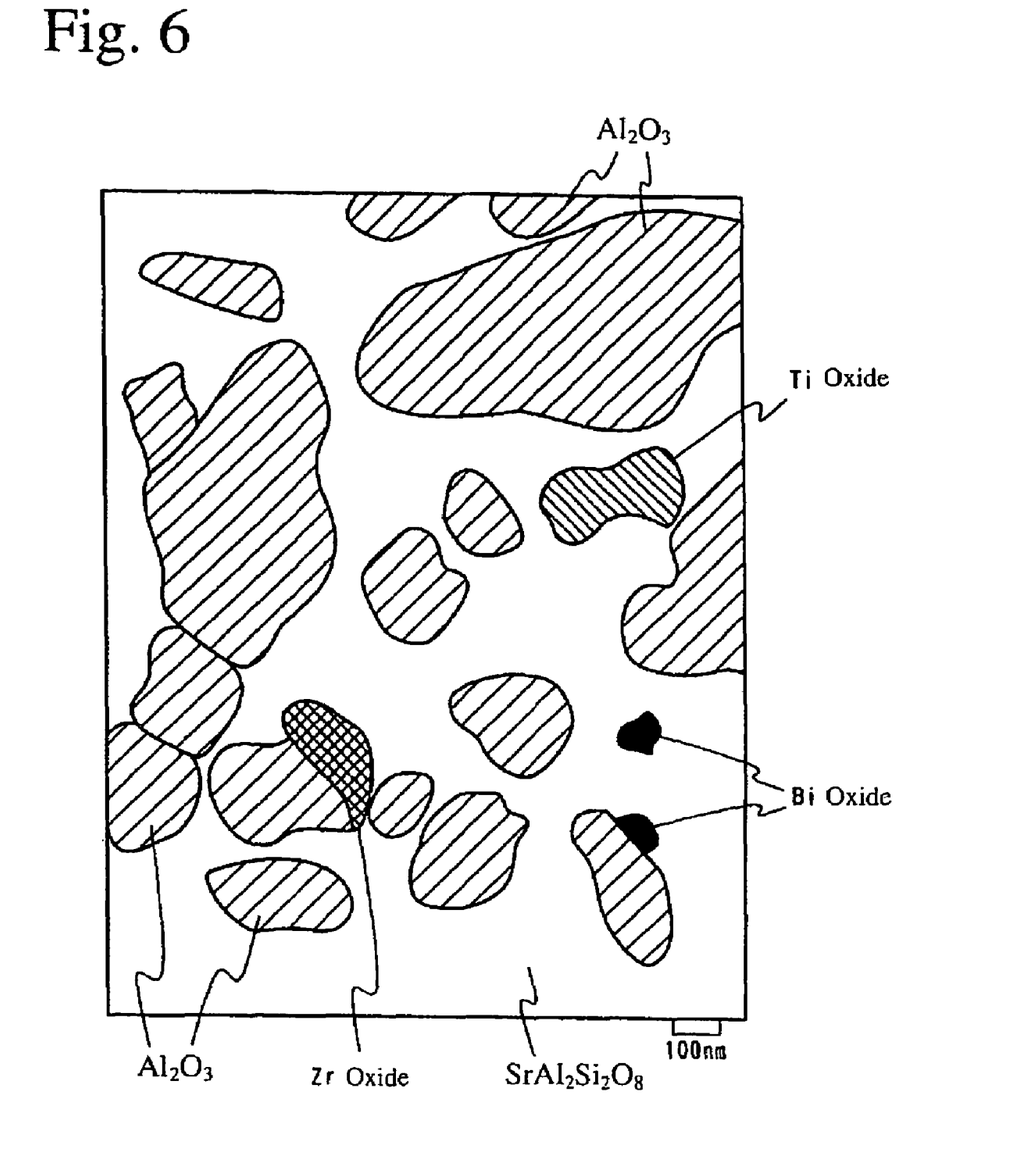
FIG. 6 is a schematic view showing a structure corresponding to the TEM photograph of FIG. 5.

FIG. 5 is a transmission electron (TEM) photomicrograph of a ground surface of Sample 13 (875° C.×2 hours), and FIG. 6 is a schematic view corresponding to the TEM photograph of FIG. 5. Though no silicate crystal was observed in the field of FIG. 5, X-ray diffraction revealed that it was precipitated in the structure. The structure also contained a Zr oxide, which appeared to be included from zirconia balls in the ball mill.

Composition analysis revealed that a matrix having this structure was based on Al$_2$O$_3$, SiO$_2$ and SrO. Because there were diffraction spots in a selected area diffraction of this matrix, the TEM photograph does not clearly show crystal boundaries. However, it is considered that crystallization occurred. Namely, it is clear that the low-temperature-sintered ceramic composition of Sample 13 had a structure in which oxide crystal grains were precipitated in a crystallized matrix based on Al$_2$O$_3$, SiO$_2$ and SrO. This result coincides with the X-ray diffraction pattern of FIG. 3 including monoclinic SrAl$_2$Si$_2$O$_8$ and hexagonal SrAl$_2$Si$_2$O$_8$.

In TEM photographs of Sample 8 (850° C.×2 hours) and Sample 12 (860° C.×2 hours), too, the boundaries of the SrAl$_2$Si$_2$O$_8$ crystal were not observed in a matrix in which oxide crystals were precipitated. Because there was a hallow pattern in the X-ray diffraction patterns of FIGS. 1 and 2, Samples 8 and 12 appeared to have structures in which the SrAl$_2$Si$_2$O$_8$ crystal was precipitated in an amorphous matrix based on Al$_2$O$_3$, SiO$_2$ and SrO.

Pluralities of TEM photographs showed that an Al$_2$O$_3$ crystal precipitated in the structure had an average diameter of 1 μm or less, indicating no tendency of progressing the growth of Al$_2$O$_3$ crystal grains even if the sintering temperature was changed.

Figure 7:
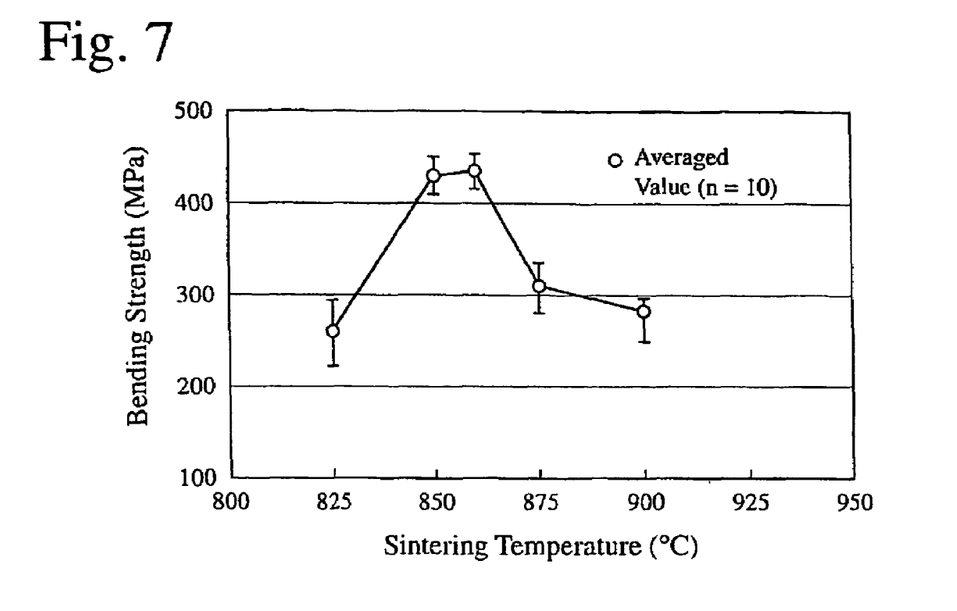
FIG. 7 is a graph showing the relation between a sintering temperature and a bending strength with respect to various low-temperature-sintered ceramic compositions in Example 2.

FIG. 7 shows the relation between a sintering temperature and a bending strength when the sintering time was 2 hours. The bending strength was an averaged value of 10 Samples. In the low-temperature-sintered ceramic composition of Example 2, the bending strength was 300 MPa or more when the sintering temperature was about 830° C., and 400 MPa or more when the sintering temperature was about 840-870° C. However, the bending strength was rapidly lowered as the sintering temperature was further elevated, and became less than 300 MPa when the sintering temperature exceeded about 880° C.

Figure 8:
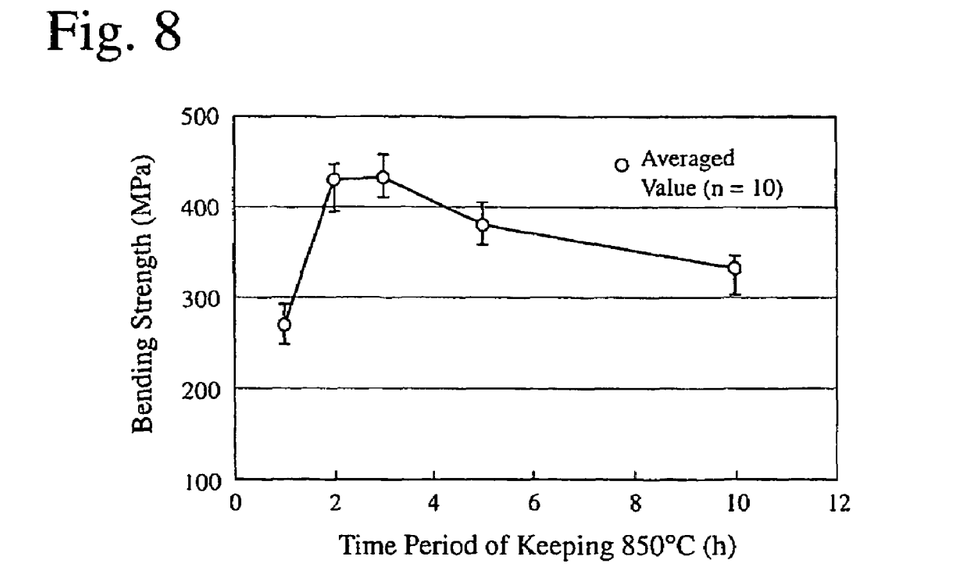
FIG. 8 is a graph showing the relation between a sintering-temperature-keeping time and a bending strength with respect to various low-temperature-sintered ceramic compositions in Example 2.

FIG. 8 shows the relation between the sintering-temperature-keeping time and bending strength when the sintering temperature was 850° C. The bending strength was an averaged value of 10 Samples. It was found that the low-temperature-sintered ceramic composition of Example 2 rather had a decreased bending strength when the keeping time was too long, even though the sintering temperature was properly 850° C. It is clear from FIG. 8 that the sintering temperature of 850° C. and the sintering time of about 2-4 hours are preferable to achieve a bending strength of 400 MPa or more in Example 2.

It is thus clear that (a) the existence of a SrAl$_2$Si$_2$O$_8$ crystal in a matrix in which an Al$_2$O$_3$ crystal and other oxide crystals are precipitated remarkably affects the bending strength, and that (b) the hexagonal SrAl$_2$Si$_2$O$_8$ among the SrAl$_2$Si$_2$O$_8$ crystal largely contributes to improvement in the bending strength.

As described above, hexagonal SrAl$_2$Si$_2$O$_8$ is precipitated in a temperature range of 900° C. or lower in the low-temperature-sintered ceramic composition comprising main components comprising oxides of Al, Si and Sr, and auxiliary components for improving low-temperature sinterability. Accordingly, the high-strength, low-temperature-sintered ceramic composition can be obtained by optimizing the sintering temperature depending on the composition.

EXAMPLE 3

A calcined powder comprising 48.7% of Al$_2$O$_3$, 34.5% of SiO$_2$, 9.5% of SrO, 4% of TiO$_2$, 1% of Bi$_2$O$_3$, 1% of Na$_2$O, 0.5% of K$_2$O, 0.3% of CuO, and 0.5% of MnO$_2$ by mass was produced in the same manner as in Example 1. This calcined powder was wet-pulverized for 40 hours in the same ball mill as in Example 1, and dried. Part of the calcined powder was then charged into a ball miil together with pure water, and pulverized to an average diameter of 1.0 μm. After adding PVA to a sluny of the resultant pulverized powder in a proportion of 1.5% by mass per the dry weight of the pulverized powder, the slurry was granulated by a spray dryer and dried, to obtain a granulated powder having an average diameter of about 0.1 mm.

The resultant granulated powder was pressed to a cylindrical green body at a pressure of 200 MPa. This green body was heated from room temperature to a temperature of 825-950° C. at a speed of 200° C./hr in the air, sintered while keeping the above temperature for 2 hours, and then cooled to room temperature at a speed of 200° C./hr.

The dielectric properties and bending strength of the resultant sintered bodies and their X-ray diffraction were measured in the same manner as in Example 1. The results are shown in Table 3. The data of alumina are also shown in Table 3.

TABLE 3

| Sample No.[1] | Sintering Temp. (° C.) | Keeping Time (hr) | Peak Intensity Ratio[2] | Bending Strength (MPa) | Relative Dielectric Constant ε | fQ (THz) | Crystal Phase Contained[3] |
|---|---|---|---|---|---|---|---|
| *15 | 825 | 2 | — | 178 | — | — | A |
| *16 | 850 | 2 | — | 260 | — | — | A |
| 17 | 875 | 2 | 100 | 425 | 8.0 | 3 | HS, A |
| 18 | 900 | 2 | 100 | 427 | 8.0 | 3 | HS, MS, A |

TABLE 3-continued

| Sample No.[1] | Sintering Temp. (° C.) | Keeping Time (hr) | Peak Intensity Ratio[2] | Bending Strength (MPa) | Relative Dielectric Constant ε | fQ (THz) | Crystal Phase Contained[3] |
|---|---|---|---|---|---|---|---|
| 19 | 925 | 2 | 89.2 | 430 | 7.9 | 4 | HS, MS, A, N |
| *20 | 950 | 2 | 0 | 290 | 7.8 | 12 | HS, A, N |
| Alumina | 1500 | — | — | 400 | 9.5 | — | — |

Note
[1]*shows Samples outside the scope of the present invention.
[2] $I_{101} / (I_{101} + I_{002}) \times 100$.
[3] HS: Hexagonal $SrAl_2Si_2O_8$, MS: Monoclinic $SrAl_2Si_2O_8$, A: $Al_2O_3$ crystal, and N: (Na, K)$Si_3AlO_8$ crystal.

In this Example, the precipitation temperature of a $SrAl_2Si_2O_8$ crystal was slightly elevated by reducing the amount of Bi and Na as compared with Example 2. It was found, however, that hexagonal $SrAl_2Si_2O_8$ was precipitated at a temperature of 875° C.-925° C., indicating that the precipitation temperature range of the hexagonal $SrAl_2Si_2O_8$ was expanded. It is thus possible to control the precipitation temperature and its range of hexagonal $SrAl_2Si_2O_8$ by the composition of the low-temperature-sintered ceramic composition. In Sample No. 19, a silicate crystal containing Na and K was precipitated, thereby obtaining both high bending strength and high dielectric properties.

EXAMPLE 4

As an example of laminated electronic parts using the high-strength, low-temperature-sintered ceramic composition of the present invention, a diode switch for use in high-frequency circuits of cell phones for switching the connection of an antenna circuit, a receiving circuit and a transmitting circuit was produced as follows.

A calcined powder comprising 49% of $Al_2O_3$, 34% of $SiO_2$, 8.2% of SrO, 3% of $TiO_2$, 2.5% of $Bi_2O_3$, 2% of $Na_2O$, 0.5% of $K_2O$, 0.3% of CuO, and 0.5% of $MnO_2$ by mass was first produced in the same manner as in Example 2.

This calcined powder was dispersed in a mixed solvent of ethanol and butanol, and pulverized to an average diameter of 1.0 μm by a ball mill. The resultant slurry was mixed with polyvinyl butyral as a binder and butyl phthalyl butyl glycolate as a plasticizer in proportions of 15% and 7.5% by mass, respectively, per 100% by mass of the calcined powder, to form a sheet-forming slurry. After defoaming and the partial evaporation of the solvent were conducted under a reduced pressure to adjust the viscosity of this slurry to about 10,000 MPa·s, the slurry was formed into a long ceramic green sheet having a dry thickness of about 80 μm by a doctor blade. For handling in subsequent steps, this ceramic green sheet was cut to a predetermined size.

Figure 9:
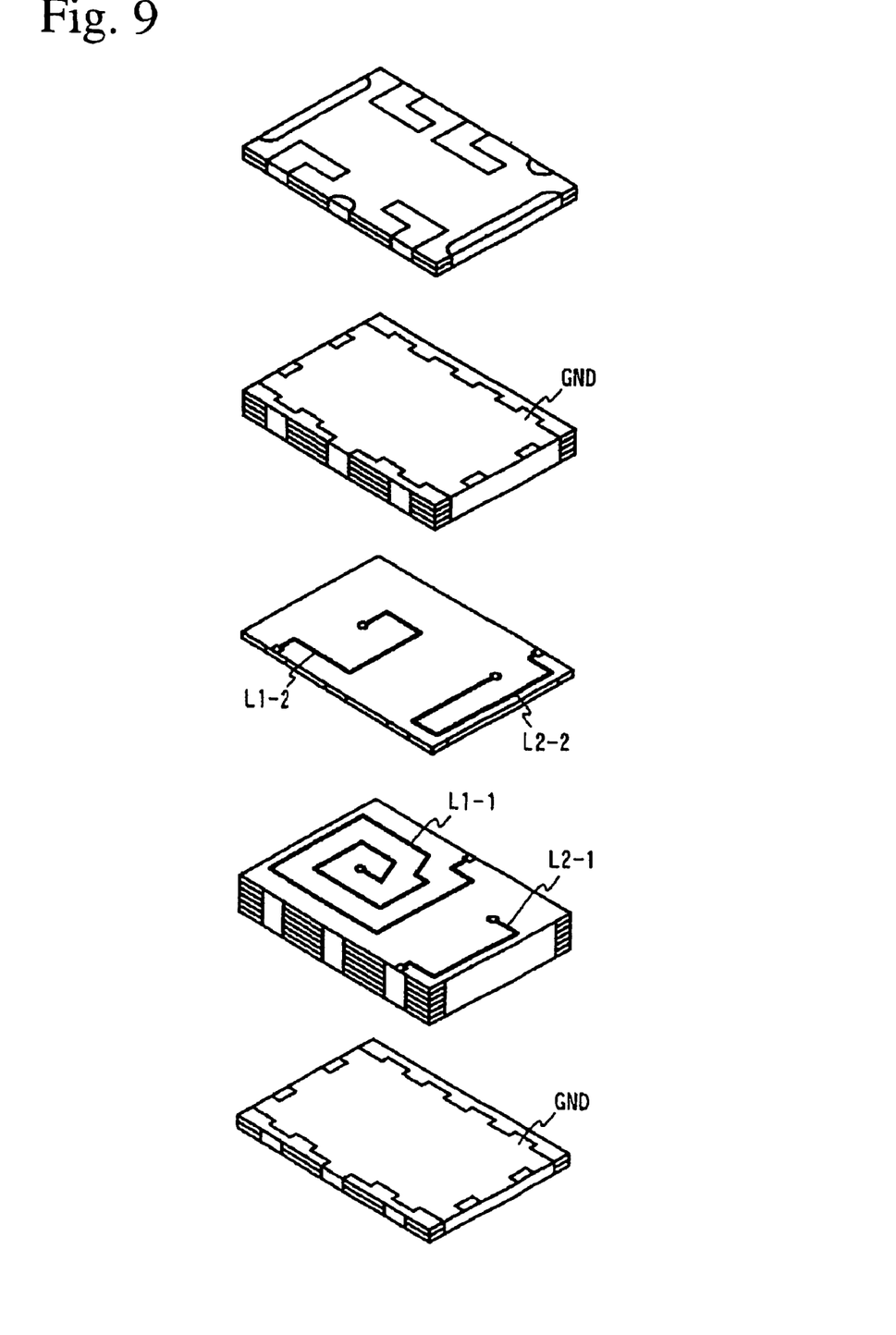
FIG. 9 is an exploded perspective view showing the laminated circuit substrate of Example 4.

Pluralities of ceramic green sheets w ere printed with a silver paste to form wiring patterns L1-1, L1-2, L2-1, L2-2 for constituting transmission lines (inductance elements), ground electrode patterns GND, and electrode patterns for mounting switching elements (see FIG. 9).

The ceramic green sheets were provided with via-holes filled with a silver paste as means for connecting wiring patterns on respective layers. The ceramic green sheets having printed conductive patterns were positioned and laminated at high precision, and then pressure-bonded. The pressure-bonding conditions were a pressure of 14 MPa, a temperature of 85° C., and a keeping time of 10 minutes.

The resultant laminate was cut to a chip size, placed on a sintering setter, and subjected to degreasing and sintering in a continuous furnace to obtain a sintered body of 4.5 mm×3.2 mm×1.0 mm. The sintering was conducted by keeping the laminate at 875° C. for 2 hours in an air atmosphere.

A ceramic portion of the sintered body was pulverized and subjected to an X-ray diffraction measurement. As a result, it was confirmed that the ceramic structure had hexagonal $SrAl_2Si_2O_8$, monoclinic $SrAl_2Si_2O_8$, an $Al_2O_3$ crystal, a $TiO_2$ crystal, and a silicate crystal. The peak intensity ratio of hexagonal $SrAl_2Si_2O_8$ to the overall $SrAl_2Si_2O_8$ crystal was 15.5%.

Side portions of the sintered body, from which internal wiring patterns were exposed, were coated with a paste for external electrodes comprising Ag as a main component, and baked at 800° C. The resultant silver surface was electroplated with nickel and tin to form terminal electrodes GND, TX, RX, VC1, VC2. The terminal electrode GND, TX, RX, VC1 among these terminal electrodes were electrically connected to electrode patterns for mounting switching elements.

Figure 10:
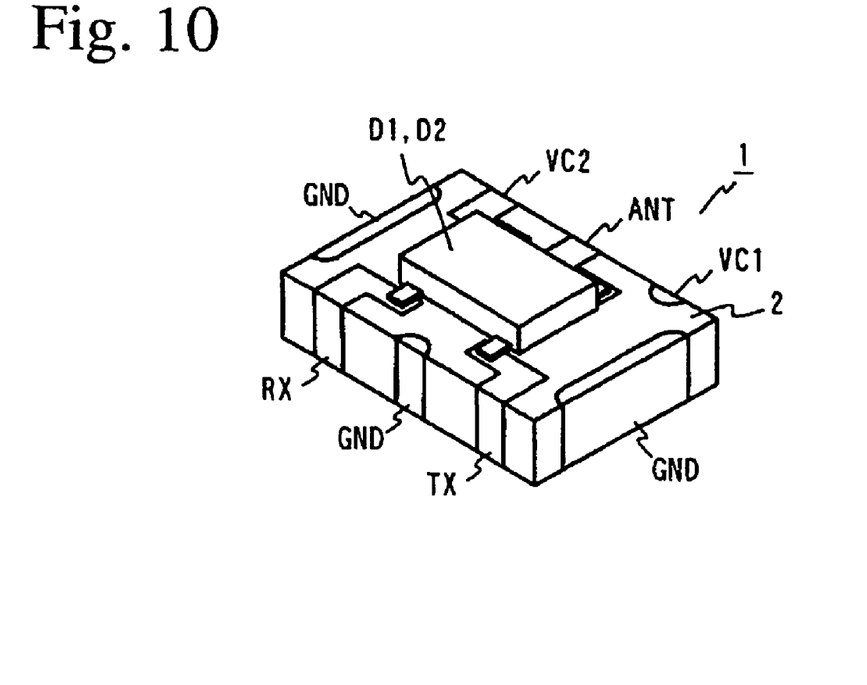
FIG. 10 is a perspective view showing the laminated electronic part of Example 4.
Figure 11:
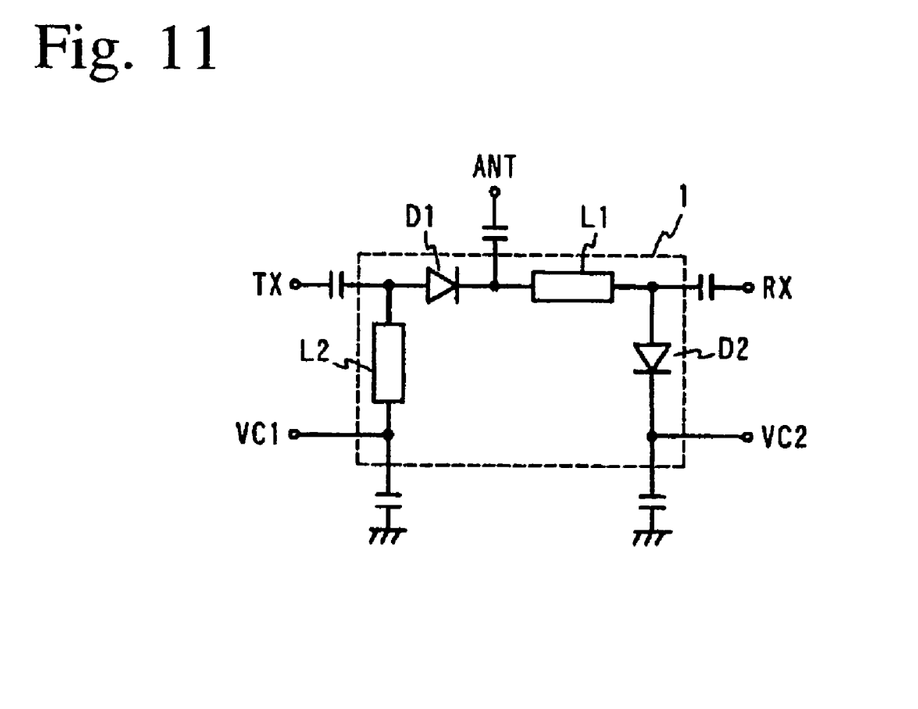
FIG. 11 is a view showing an equivalent circuit of the laminated electronic part of Example 4.

Diodes D1, D2 as switching elements were mounted onto the electrode patterns of the laminated circuit substrate thus obtained, to provide a laminated electronic part 1 shown in FIG. 10. The laminated electronic part 1 constitutes a broken line portion in the equivalent circuit shown in FIG. 11.

Though inductance elements were constituted by electrode patterns in this Example, chip inductors, coils, etc. may be mounted. Also, capacitor elements for cutting a DC component may be formed by the electrode patterns in the circuit substrate, or chip capacitors may be mounted onto the circuit substrate. Though diode switches are likely to be connected to filter elements such as lowpass filters, bandpass filters, etc., the above filter elements may be SAW filters mounted onto the circuit substrate. Further, filter elements constituted by inductance elements and capacitance elements may be formed by electrode patterns in the circuit substrate, or mounted onto the circuit substrate as chip parts.

The terminal electrodes VC1, VC2 were connected to DC power sources to turn on or off the diodes D1, D2, such that a high-frequency signal passed between the terminal electrodes ANT and RX, and between the terminal electrodes ANT and TX. As a result, it was confirmed that there was little signal transmission loss (insertion loss), indicating that the laminated electronic part 1 had excellent electric properties.

The terminal electrodes of the laminated circuit substrate were soldered to an experimental printed circuit board, to evaluate the resistance of the laminated circuit substrate to the peeling of terminals and cracking by bending and twisting the printed circuit board. As a result, it was found that this laminated circuit substrate was extremely improved than conventional ones.

It is clear from this Example that because the low-temperature-sintered ceramic composition of the present invention can be simultaneously sintered with a low-melting-point metal such as Ag, etc., the formation of conductive patterns of the low-melting-point metal on dielectric layers made of the low-temperature-sintered ceramic composition of the present invention can provide laminated electronic parts with excellent electric properties and mechanical strength.

APPLICABILITY IN INDUSTRY

Because the low-temperature-sintered ceramic composition of the present invention has hexagonal $SrAl_2Si_2O_8$ in a structure, it has high strength and practical dielectric properties, and it is sintered at such a low temperature as 1000° C. or lower. Accordingly, it can be simultaneously sintered with a low-melting-point electrode material such as silver, gold, copper, etc. Also, because the high-strength, low-temperature-sintered ceramic composition of the present invention is excellent in dielectric properties such as a dielectric constant, fQ, etc., and has improved mechanical strength than the conventional ones, it can be simultaneously sintered with a low-melting-point metal to form a laminated circuit substrate resistant to cracking and breakage. Accordingly, the laminated electronic parts formed by the high-strength, low-temperature-sintered ceramic composition of the present invention have excellent electric properties and mechanical strength.

What is claimed is:

1. A high-strength, low-temperature-sintered ceramic composition having a structure comprising crystal phases of $SrAl_2Si_2O_8$, $Al_2O_3$, titanium oxide and silicon oxide, respectively, at least part of said crystal phase of $SrAl_2Si_2O_8$ determined by an X-ray diffraction measurement being composed of hexagonal $SrAl_2Si_2O_8$, said ceramic composition having a bending strength of 300 MPa or more.

2. The high-strength, low-temperature-sintered ceramic composition according to claim 1, comprising hexagonal $SrAl_2Si_2O_8$ in an $Al_2O_3$—$SiO_2$—SrO-based matrix, which contains an $Al_2O_3$ crystal, a $TiO_2$ crystal and a $SiO_2$ crystal.

3. The high-strength, low-temperature-sintered ceramic composition according to claim 2, wherein a part of said matrix is an amorphous phase.

4. The high-strength, low-temperature-sintered ceramic composition according to claim 2, wherein said matrix further comprises monoclinic $SrAl_2Si_2O_8$.

5. The high-strength, low-temperature-sintered ceramic composition according to claim 1, wherein said $SrAl_2Si_2O_8$ crystal being composed of hexagonal $SrAl_2Si_2O_8$ alone or hexagonal $SrAl_2Si_2O_8$ and monoclinic $SrAl_2Si_2O_8$, a peak intensity ratio represented by $I_{101}/(I_{101}+I_{002})\times 100$ being 5% or more in an X-ray diffraction measurement by a Cu—Kα line, wherein $I_{101}$ represents a peak intensity of a (101) plane of the hexagonal $SrAl_2Si_2O_8$, and $I_{002}$ represents a peak intensity of a (002) plane of the monoclinic $SrAl_2Si_2O_8$.

6. The high-strength, low-temperature-sintered ceramic composition according to claim 1, wherein said peak intensity ratio is 50% or more.

7. The high-strength, low-temperature-sintered ceramic composition according to claim 1, wherein a ratio of said hexagonal $SrAl_2Si_2O_8$ in said $SrAl_2Si_2O_8$ crystal being 60% or more, and said ceramic composition having a bending strength of 400 MPa or more.

8. The high-strength, low-temperature-sintered ceramic composition according to claim 1, wherein said $Al_2O_3$ crystal is in the form of grains and said grains have an average diameter of 1 μm or less.

9. The high-strength, low-temperature-sintered ceramic composition according to claim 1, comprising (a) 10-60% by mass of Al (as $Al_2O_3$), 25-60% by mass of Si (as $SiO_2$) and 7.5-50% by mass of Sr (as SrO), and (c) inevitable impurities.

10. A high-strength, low-temperature-sintered ceramic composition having a structure comprising $SrAl_2Si_2O_8$ and $Al_2O_3$, said ceramic composition having a bending strength of 300 MPa or more, wherein it comprises (a) 100% by mass of main components comprising 10-60% by mass of Al (as $Al_2O_3$), 25-60% by mass of Si (as $SiO_2$), 7.5-50% by mass of Sr (as SrO), (b) auxiliary components comprising at least one selected from the group consisting of 0.1-10% by mass of Bi (as $Bi_2O_3$), 0.1-5% by mass of Na (as $Na_2O$), 0.1-5% by mass of K (as $K_2O$) and 0.1-5% by mass of Co (as CoO), and at least one selected from the group consisting of 0.01-5% by mass of Cu (as CuO), 0.01-5% by mass of Mn (as $MnO_2$), 0.01-5% by mass of Ag and 0.01-2% by mass of Zr (as $ZrO_2$), and (c) inevitable impurities.

11. A high-strength, low-temperature-sintered ceramic composition having a structure comprising $SrAl_2Si_2O_8$ and $Al_2O_3$, said ceramic composition having a bending strength of 300 MPa or more, wherein it comprises (a) 100% by mass of main components comprising 10-60% by mass of Al (as $Al_2O_3$), 25-60% by mass of Si (as $SiO_2$), 7.5-50% by mass of Sr (as SrO) and 20% or less by mass of Ti (as $TiO_2$), (b) auxiliary components comprising at least one selected from the group consisting of 0.1-10% by mass of Bi (as $Bi_2O_3$), 0.1-5% by mass of Na (as $Na_2O$), 0.1-5% by mass of K (as $K_2O$) and 0.1-5% by mass of Co (as CoO), and at least one selected from the group consisting of 0.01-5% by mass of Cu (as CuO), 0.01-5% by mass of Mn (as $MnO_2$), 0.01-5% by mass of Ag and 0.01-2% by mass of Zr (as $ZrO_2$), and (c) inevitable impurities.

12. A method for producing the high-strength, low-temperature-sintered ceramic composition recited in any one of claims 1-3 or 4-11, comprising calcining aluminum oxide, silicon oxide and strontium oxide, or aluminum oxide, silicon oxide, strontium oxide and titanium oxide to obtain a calcined powder comprising a silicate glass containing $Al_2O_3$ and $TiO_2$, molding said calcined powder to a ceramic green body, followed by sintering said green body under such temperature and time conditions that a ratio of hexagonal $SrAl_2Si_2O_8$ in a $SrAl_2Si_2O_8$ crystal formed in a ceramic structure becomes 5% or more.

13. A laminated electronic part comprising pluralities of dielectric layers made of the high-strength, low-temperature-sintered ceramic composition recited in claim 1, each of said dielectric layers being provided with a conductive pattern of a low-melting-point metal.

14. The laminated electronic part according to claim 13, wherein said low-melting-point metal is silver, copper, gold or an alloy thereof.

15. The laminated electronic part according to claim 13, wherein said conductive pattern constitutes an inductance element and/or a capacitance element.

16. The laminated electronic part according to claim 13, onto which at least one selected from the group consisting of an inductance element, a capacitance element, a switching element and a filter element is mounted.

17. The high-strength, low-temperature-sintered ceramic composition according to claim 1, further comprising monoclinic $SrAl_2Si_2O_8$.

18. A method for producing the high-strength, low-temperature-sintered ceramic composition recited in claim 17, comprising calcining aluminum oxide, silicon oxide and strontium oxide, or aluminum oxide, silicon oxide, strontium oxide and titanium oxide to obtain a calcined powder comprising a silicate glass containing $Al_2O_3$ and $TiO_2$, molding said calcined powder to a ceramic green body, followed by sintering said green body under such temperature and time conditions that a ratio of hexagonal $SrAl_2Si_2O_8$ in a $SrAl_2Si_2O_8$ crystal formed in a ceramic structure becomes 5% or more.

* * * * *